US008675328B2

(12) United States Patent
Altemose et al.

(10) Patent No.: US 8,675,328 B2
(45) Date of Patent: Mar. 18, 2014

(54) BATTERY CHARGE PROTECTION SYSTEM

(75) Inventors: George Altemose, Stony Brook, NY (US); Michael Consi, Lindenhurst, NY (US)

(73) Assignee: Aeroflex Plainview, Inc.

( * ) Notice: Subject to any disclaimer, the term of this patent is extended or adjusted under 35 U.S.C. 154(b) by 205 days.

(21) Appl. No.: 13/366,596

(22) Filed: Feb. 6, 2012

(65) Prior Publication Data

US 2012/0200968 A1     Aug. 9, 2012

Related U.S. Application Data

(60) Provisional application No. 61/440,135, filed on Feb. 7, 2011.

(51) Int. Cl.
     *H02H 3/20*            (2006.01)

(52) U.S. Cl.
     USPC ............................................. 361/86

(58) Field of Classification Search
     USPC ............................................. 361/86
     See application file for complete search history.

(56) References Cited

U.S. PATENT DOCUMENTS

| | | |
|---|---|---|
| 4,061,955 A | 12/1977 | Thomas |
| 4,467,266 A | 8/1984 | Ritchie |
| 4,679,146 A | 7/1987 | Kubo |
| 5,298,851 A | 3/1994 | DeNardis |
| 5,327,068 A | 7/1994 | Lendrum et al. |
| 5,621,277 A | 4/1997 | Ricca |
| 5,708,348 A | 1/1998 | Frey et al. |
| 5,714,869 A | 2/1998 | Tamechika et al. |
| 5,789,900 A | 8/1998 | Hasegawa et al. |
| 6,492,791 B1 | 12/2002 | Saeki et al. |
| 6,670,790 B2 | 12/2003 | Stellberger |
| 7,719,234 B2 | 5/2010 | Carrier et al. |
| 8,018,699 B2 | 9/2011 | Smith et al. |
| 2002/0006814 A1* | 1/2002 | Fukunishi .................... 455/572 |

* cited by examiner

*Primary Examiner* — Jared Fureman
*Assistant Examiner* — Kevin J Comber
(74) *Attorney, Agent, or Firm* — Thomas A. O'Rourke; Bodner & O'Rourke, LLP (57) ABSTRACT

A system comprises a battery including one or more cells, an energy source, a load, and a battery protection circuit coupled to the battery, the energy source and the load. The circuit determines if the charge of each cell is at/above a predetermined, band gap supplied threshold voltage, which results in disconnecting of the battery from the energy source. The circuit also may determine if the charge of any cell is at/below a second predetermined level, which may result in disconnecting of the battery from the load. The circuit may be radiation-hardened (e.g., via redundancy), through the use of two sets of field effect transistors, two logic gates, two groups of comparator circuits, and two relays. The circuit provides multiply redundant protection comprising: redundantly assessing the overvoltage determination; redundantly triggering battery isolation; and preventing inadvertent isolation and non-charging, occurring absent overvoltage, through redundant first and second relays.

20 Claims, 7 Drawing Sheets

BATTERY CHARGE PROTECTION SYSTEM

CROSS REFERENCES TO RELATED APPLICATIONS

This application claims priority on U.S. Provisional Application Ser. No. 61/440,135 filed on Feb. 7, 2011, the disclosures of which are incorporated herein by reference.

FIELD OF THE INVENTION

The present invention relates to electronic circuits, and in particular, to a circuit configured to monitor the charge of one or more cells in a battery and to prevent the charge of each cell from exceeding, and in some instances also falling below, predetermined charge levels.

BACKGROUND OF THE INVENTION

Electronic apparatuses that cannot be continuously coupled to stationary power sources may instead employ localized sources of energy like batteries. The growing popularity of mobile apparatuses for use in communication, productivity, entertainment, etc. is an obvious example of how electronic devices may utilize batteries in order to support apparatus mobility. Batteries may be disposable or rechargeable, with technological development currently being focused on rechargeable solutions in view of resource conservation efforts and user convenience. In the area of rechargeable batteries, the evolution of new battery technologies and compositions has yielded rechargeable batteries that can provide more power, longer life and faster recharge times, which has led to the expanded implementation of rechargeable batteries in various areas.

One technology that has seen wide acceptance is lithium-ion (Li-ion) batteries. Li-ion batteries may comprise one or more individual Li-ion cells that can typically provide long operational life and short recharge times that may prove to be beneficial in many applications. However, while emerging battery technologies like Li-ion compositions may be able to provide strong performance, these benefits come with some maintenance requirements. For example, Li-ion battery performance may be negatively impacted by conditions where the cells in a battery are unbalanced (e.g., one cell in a battery has a higher charge than another cell), as well as the cells being undercharged or overcharged. Undercharging Li-ion batteries can result in electrical shorts that cause the cells to discharge to a state where it is possible the battery cannot recover (e.g., the cells will not recharge). In more extreme cases, overcharging batteries can result in failures including white-hot flames or explosions that can damage equipment.

Even in view of these care requirements and potential failures, safeguards may be built into commercial apparatuses to provide protection that, even if a failure occurs, may simply lead to the apparatus being replaced at a nominal cost. However, some battery applications are not quite so easy to address. For example, satellites that orbit the Earth supporting positioning systems (e.g., GPS), communications, military operations, etc. may also employ rechargeable batteries (e.g., Li-ion batteries). Solar arrays in a satellite may recharge batteries for powering operations when sunlight is unavailable. Once a satellite goes into service, implementing fixes may be extremely difficult or impossible. The failure of a power system in a satellite may not only be catastrophic from the standpoint of the loss of a multi-million dollar piece of equipment, but may also put into jeopardy the mission for which the satellite is intended, which could result in further economic losses, or even injury or loss of life (e.g., in military satellite applications, in manned orbiting platforms like the International Space Station, etc.). The challenge presented by the example of satellite operation is made even more problematic given the harsh environment in which satellites operate. Without the protection granted by the Earth's atmosphere, the typical failure modes for batteries and related circuitry become more probable.

SUMMARY OF THE INVENTION

Various example embodiments of the present disclosure may be directed to a system and electronic apparatuses for maintaining battery operation. A system may comprise a battery comprising one or more cells, an energy source, a load and a circuit coupled to at least the battery, the energy source and the load. The circuit may comprise elements configured to measure the charge of each of the one or more cells. If it is determined that the charge of any of the one or more cells is at or above a predetermined charge level, the circuit may disconnect the one or more cells from the energy source. In at least one example implementation, it may also be possible for the circuit to determine if the charge of any of the one or more cells is at or below a second predetermined charge level when measuring the charge of each cell. In instances where it is determined that the charge measured in any of the one or more cells is at or below the second predetermined charge level, the circuit may disconnect the one or more cells from the load.

In accordance with at least one embodiment of the present invention, the elements of the circuit may comprise a monitoring circuit corresponding to each cell and redundant relay control circuits. The monitoring circuit may be configured to generate a certain output (e.g., a logical one or zero) to the redundant relay control circuits if the cell is determined to be at or above the predetermined charge level. In an alternative configuration, it may also be possible for the monitoring circuit to further output a second certain output to a second set of redundant relay control circuits if the cell is determined to be at or below a second predetermined charge level. In either configuration, the monitoring circuit may comprise at least one test injection point for causing the circuit to operate regardless of whether the one or more cells are at or above the predetermined charge level (e.g., or at or below the second predetermined charge level). Either of the example monitoring circuits may also be implemented redundantly in the circuit, wherein there may be multiple (e.g., two) monitoring circuits for each cell, and each example monitoring circuit may further be comprised within a single electronic apparatus such as an application specific integrated circuit (ASIC).

In at least one example implementation, disconnecting the one or more cells from the energy source may comprise actuating redundant relays comprised within the circuit by opening at least one of two relays arranged serially between the battery and the energy source. In a similar operation, the one or more cells may be disconnected from the load (e.g., if any of the cells is at or below a second predetermined energy level) by actuating redundant relays comprised within the circuit by opening at least one of two relays arranged serially between the battery and the load. Regardless of the particular circuit configuration, the circuit may further comprise at least one of reset coil circuits or latch coil circuits configured to actuate either of the sets of redundant relays.

The foregoing summary includes example system and apparatus embodiments that are not intended to be limiting. The above embodiments are used merely to explain selected aspects or steps that may be utilized in implementations of the present invention. However, it is readily apparent that one or more aspects, or steps, pertaining to an example embodiment can be combined with one or more aspects, or steps, of other embodiments to create new embodiments still within the scope of the present invention. Therefore, persons of ordinary skill in the art would appreciate that various embodiments of the present invention may incorporate aspects from other embodiments, or may be implemented in combination with other embodiments.

BRIEF DESCRIPTION OF THE DRAWINGS

The description of the various example embodiments is explained in conjunction with appended drawings, in which.

DETAILED DESCRIPTION OF THE INVENTION

While illustrative implementations of one or more embodiments of the present invention are provided below, various changes can be made therein without departing from the spirit and scope of the invention, as described in the appended claims.

In accordance with at least one embodiment of the present invention, a battery may comprise multiple cells. While a multi-cell Li-ion battery may be utilized for the sake of explanation in the following disclosure, the various embodiments of the present invention are not intended to be limited to use with only this battery technology. The various embodiments of the present invention may be utilized with, for example, any power source or battery technology that may impose similar operational requirements in that the condition of the power source or battery must be regulated in order to maintain performance, or in more extreme cases, to avoid failure.

In the examples disclosed herein, circuits may be configured to prevent a lithium-ion (Li-ion) battery, comprising one or more lithium-ion cells that are connected in series, from being overcharged, and in some instances from becoming undercharged (or overly-discharged). For example, the voltage of each cell in a battery may be measured, and if any measured voltage exceeds a predetermined charge level (e.g., 4.5 V), power that would normally charge the battery supplied from an external source (e.g., an electrical grid) or a localized alternative source (e.g., a solar panel array) may be disconnected from the battery. Disconnection from the power source prevents the total battery voltage, and thus the individual cell voltages, from increasing any further. Avoiding overcharging is very important for Li-ion batteries because, unlike other types of cells, overcharging Li-ion cells may cause catastrophic destruction of the battery (e.g., white-hot flame or explosion) that may potentially damage the equipment in which the battery resides. While the possibility of this failure mode is known, the manner in which designers may address battery condition maintenance issues in Li-ion and other similar battery types may vary widely depending on the application (e.g., cell phones, laptop computers, automobiles, satellites, etc.).

The various embodiments of the present invention, as disclosed herein, may be applied in many scenarios, but have characteristics that make them uniquely suitable for use in satellites. Satellites are very expensive. The cost of a typical satellite may be in the range of $200 million to $400 million. Substantially all satellites being built now and in the foreseeable future will utilize Li-ion batteries charged from a solar array. A catastrophic failure of a Li-ion battery system in a satellite would have an excellent chance to destroy the satellite. Therefore, it would be very beneficial to provide a system that prevents catastrophic failures from occurring.

However, satellites are subject to operational conditions that make assurances of a particular result difficult. Electronic circuits in space are continuously subjected to radiation that is not encountered on Earth because of filtering by the Earth's atmosphere. Circuits for space use must therefore have special design features to make them "radiation hardened" or "rad-hard" that render them immune to, or at least tolerant to, degradation or failure from the effects of radiation.

At least two types of radiation may impact the operation of electronics in space: total dose radiation and single event upset (SEU). Total dose radiation may be deemed similar to X-ray radiation in the sense that it has a long-term cumulative effect. It is measured in units of rads (or krads). For example, an orbiting satellite might experience 100 krads of total dose over a ten-year mission life, which means that circuits in the satellite that contain hundreds of bipolar (e.g., NPN or PNP) transistors are constantly exposed to radiation. The long-term effect of this exposure may be a substantial reduction in current gain ("hFE" or "beta") for the bipolar transistors. For example, an NPN transistor might typically have a beta of 100 at the time of manufacture, and this value may decay over time due to use, environment, etc. For earth-bound applications, conservative worst-case designs might require that circuits continue to work with bipolar transistors that have betas as low as 70. However, rad-hard designs may require circuits to work with bipolar transistors having betas as low as 10 due to continuous exposure. In order to make up for this disparity, rad-hard circuits may need to have substantially more transistors.

SEU is an entirely different phenomenon. SEU is caused by a single high energy particle from space, such as a high energy proton or alpha particle. If a high energy particle strikes an electronic circuit, it can cause a transistor to conduct, typically for a few microseconds. The impact of this event depends on the circuit. Impact with a flip-flop can cause the component to change state. In RAM memory, a bit may change from 0 to 1, or from 1 to 0. With respect to power circuits where several transistors in series between the (+) power supply and ground, if all of these transistors turned on at the same time, which could happen as a result of a SEU, the resulting current through the transistors would not be limited, and could destroy the transistors.

Figure 1:
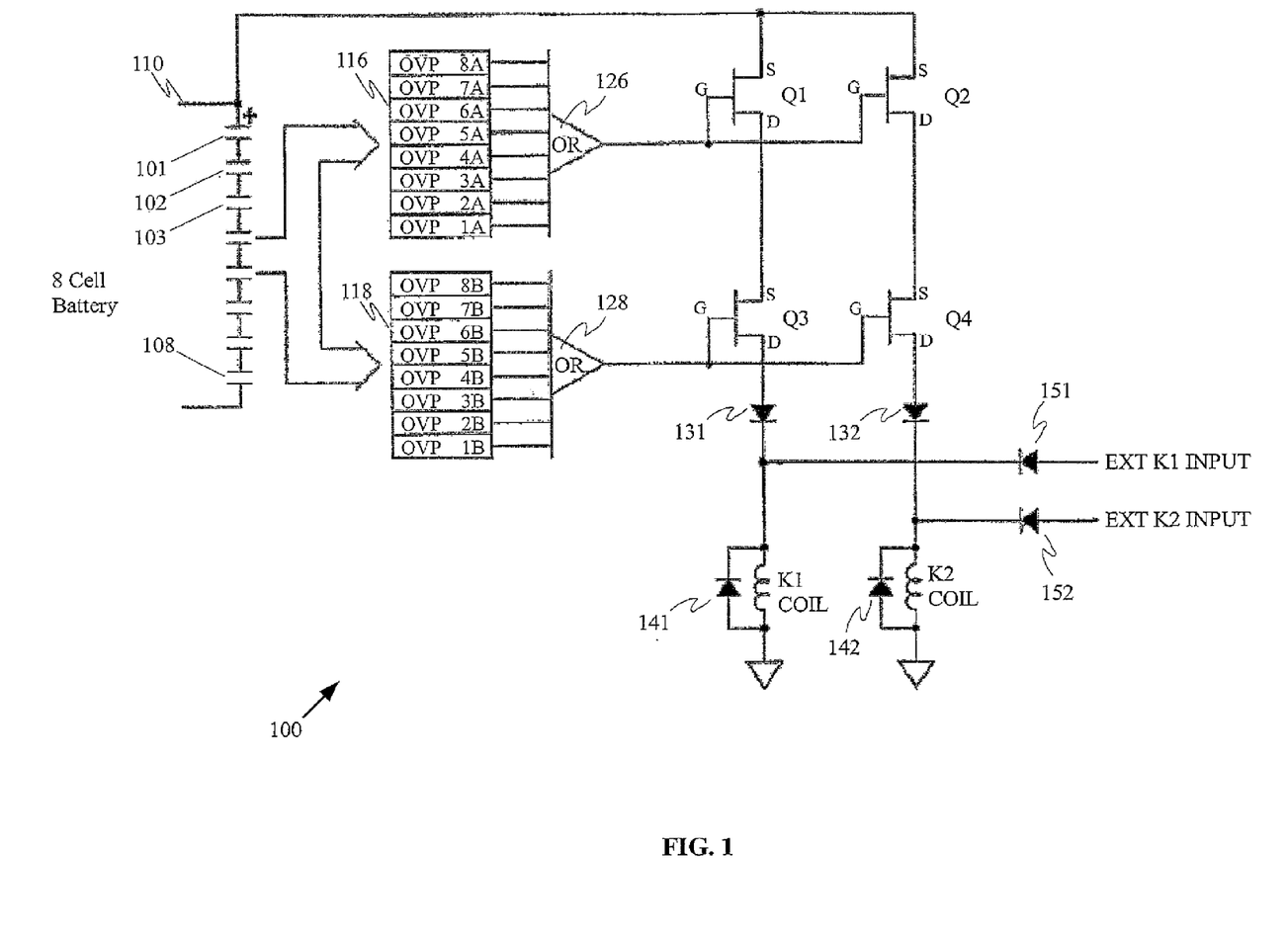
FIG. 1 discloses an example battery overcharge protection circuit in accordance with at least one embodiment of the present invention.

In accordance with at least one embodiment of the present invention, the effects of total dose and SEU radiation on a battery overcharge circuit may be addressed through circuit design. Referring to FIG. 1, an example circuit 100 may comprise Li-ion battery 110 including eight cells 101-108. While example battery 110 has eight cells 101-108, the various embodiments of the present invention are not limited to implementations containing only one eight cell battery, and thus, may be applied to multi-battery systems comprising more or less cells, depending upon the requirements of the application. The charge of each cell 101-108 in battery 110 may serve as an input to the over-voltage protection (OVP) blocks 116 and 118. OVP blocks 116 and 118 are duplicates of each other, or "redundant" in that if any of the individual OVP monitoring circuits fail, the secondary redundant circuit may continue to operate. In a satellite system, battery 110 may be charged by a solar array (not shown) coupled to battery 110 through relays K1 and K2. A battery control circuit (not shown) may control the flow of energy provided by the solar array to charge battery 110 to a voltage of about 4.1 V. When the satellite passes into eclipse (e.g., the earth is positioned between the satellite and the sun), battery 102 may supply power to a load (e.g., other electronic systems for control, communication, telemetry, observation, positioning, etc.). During this time the voltage of battery 110 may drop to about 3.2 V. The satellite may then exit the eclipse, and battery 110 may again be charged. This charging and discharging of battery 110 continues to repeat indefinitely as the satellite continues to orbit the Earth.

However, during the charge phase it may be possible for the battery control circuit to malfunction (e.g., due to damage caused by total dose radiation or SEU), wherein battery 110 may continue to be charged by the solar panels even after reaching the nominal voltage. If any cell voltage reaches 4.6 V, the battery can explode and destroy the satellite. OVP circuit blocks 116 and 118 may help to prevent this from occurring. For example, if any cell voltage reaches a predetermined voltage level (e.g., 4.5 V), OVP circuits in OVP circuit blocks 116 and 118 may detect the condition and trigger relays K1 and/or K2 to open, disconnecting battery 110 from the energy source (e.g., solar arrays) and preventing further increases in the voltage of battery 110.

Figure 2:
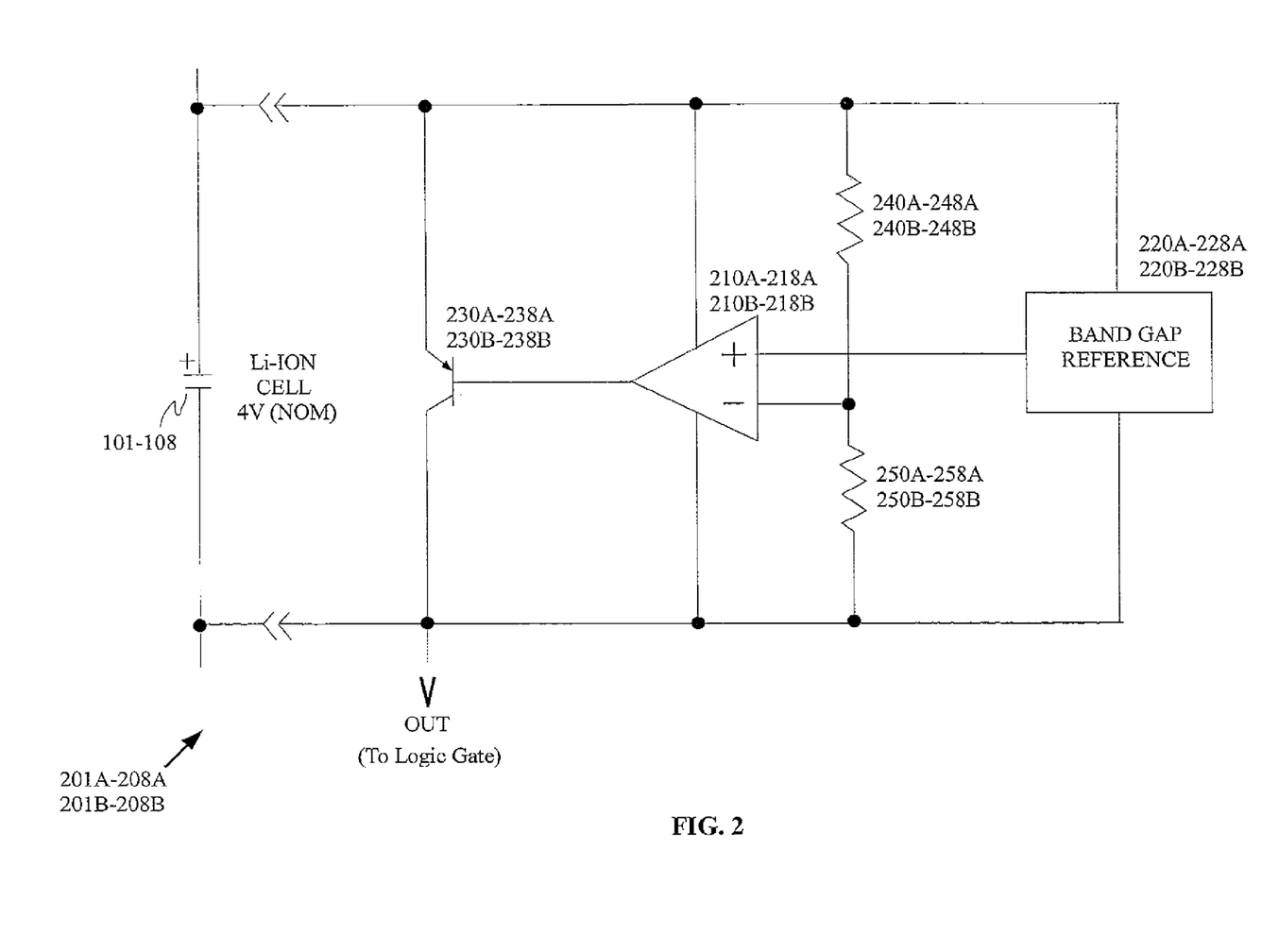
FIG. 2 an example battery cell monitoring circuit in accordance with at least one embodiment of the present invention.

OVP blocks 116 and 118 may comprise two groups of comparator circuits (201A-208A and 201B-208B), each with 8 comparators 261A-268A and 281B-288B, respectively. An example of the individual comparator circuits 200A-208A and 201B-208B is disclosed in FIG. 2 for monitoring of each of the cells 101-108. Each comparator circuit 200 may supply a digital output (e.g., two of the PNP transistors 230A-238A and 230B-238B may turn on) if its cell voltage exceeds a predetermined charge level, such as 4.5 V, as determined by a comparison of the cell voltage against a band gap reference 220A-228A and 220B-228B. For example, if in FIG. 1 cell number 6 of battery 110 exceeds 4.5 V, then the digital output of OVP circuits 216A and 216B will both be a "1," whereas when the voltage in cell number 6 (or any of the cells) is below the threshold, there will be no output or the output will be a "0". The output of the comparators 210A-218A are supplied to a first logic gate 126, while the output of comparators 210B-218B are supplied to a second logic gate 128, with both sets of comparator outputs therein being subject to an "OR" operation. If any one or another of the comparators in the first group of comparator circuits has outputted a "1," the result of the OR operation of the gate 126 comprises a digital signal, which will also be a "1," and which is supplied in parallel to the gate terminals ("G") of both Q1 and Q2, each of which may be a P-Channel power field effect transistor (FET). Also, the result of the OR operation of OR gate 128 comprises a digital signal that is supplied in parallel to the gate terminals of Q3 and Q4. When both Q1 and Q3 are on, this will energize the coil of relay K1. When both Q2 and Q4 are on, this will energize K2.

Circuit 100 in FIG. 1 therefore contains multiple redundancies in order to protect battery 102, even in the event of failures or SEU events. For example, coils K1 and K2 are redundant. If either the K1 or K2 coils fail (e.g., they experience a welded contact, open coil, shorted coil, etc.), the other coil may still function to isolate the battery. The four power FETs Q1, Q2, Q3, and Q4 are also redundant. If any FET shorts, its series FET may prevent the relay from turning on. If any of the FETs opens, the two parallel FETs will allow the other relay to energize. OVP blocks 116 and 118 are redundant. If any one comparator fails, it may energize its two FETs. However, this alone cannot energize a relay unless a comparator in the other group also turns on. These features apply to hard failures (e.g., a shorted FET) and SEU events that are recoverable.

Figure 3:
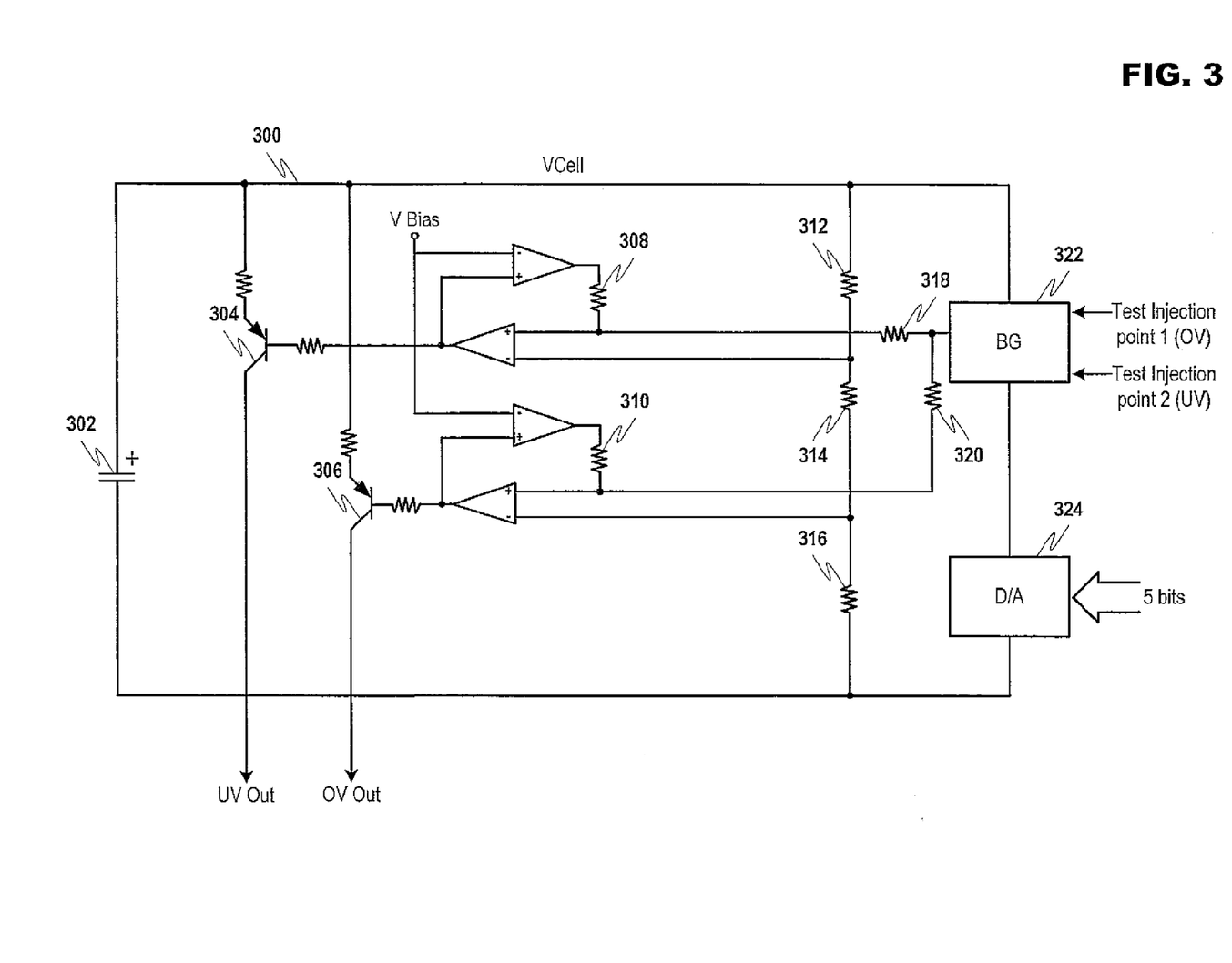
FIG. 3 discloses an alternative example battery cell monitoring circuit, including test injection and cell undercharge monitoring, in accordance with at least one embodiment of the present invention.

FIG. 3 discloses an alternative configuration for a comparator circuit. Circuit 300 may be coupled to cell 302 and may comprise resources not only for measuring whether the voltage of battery 302 is at or above a predetermined charge level, but may also monitor whether the charge of cell 302 is at or below a second predetermined voltage level. In addition to Li-ion cells being prone to explode if they are overcharged (e.g., >4.500 V), they may also have problem if they are over-discharged (e.g., the charge drops below <2.700 V). An over-discharge condition can lead to electrical shorts that may prevent the battery from recharging. While in the latter instance a battery does not burn or explode, the inability to recharge the battery may still render a device (e.g., a satellite) unusable. Therefore, it is beneficial to monitor batteries for instances both when cells may potentially become overcharged and also when cells may become over-depleted.

In FIG. 3, various individual components may have values that vary depending on the application in which the circuit is being employed. For example, the voltage for Band Gap (BG) reference 322 may be set to 1.25V. Moreover, resistor values for a circuit may also vary, but in this example may have the following values: resistors 308 and 310 may each be 400K, resistor 312 may be 19.333K, resistor 314 may be 6.667K, resistor 316 may be 10K, resistors 318 and 320 may each be 8K. VBias may be set to +1V. In operation, circuit 300 may have two comparators that monitor cell 302 to determine whether the charge of the cells is at or above a first predetermined value (e.g., 4.5V) or at or below a second predetermined value (e.g., 2.7V). If the over-voltage condition exists (e.g., the cell is measured to be at or above 4.5V) then the first comparator circuit may trigger PNP transistor 306 to be activated. If an under-voltage condition exists (e.g., the cell is measured to be at or below 2.7V) then the second comparator circuit may trigger PNP transistor 304 to be activated.

The example circuit of FIG. 3 may further comprise one or more test injection points for simulating an over-voltage or under-voltage condition. For example, after circuit 302 has been fully assembled and tested it may then be attached to the battery. Under normal circumstances, the circuit cannot then be tested without jeopardizing the battery. Testing the circuit may be important for satellites, especially immediately prior to launch, in order to verify that the circuit is working properly. Therefore, the use of these test injection point, which comprise discrete inputs to the bandgap circuit, allows for testing, even when the circuit is coupled to the battery, but without disturbing the battery. These test inputs allow Ground Support Equipment (GSE) to artificially change BG reference voltage 322, and thereby artificially induce an over-voltage or under-voltage condition, simulating a failure, in order to exercise/test all of the individual voltage sensing circuits just prior to launch.

Circuit 300 may further include digital to analog (D/A) converter 324 for setting the over-voltage and/or under-voltage thresholds. The D/A (FIG. 3) serves to calibrate (or trim) the voltage threshold of the circuit after final assembly, by adjusting the output voltage of the bandgap regulator circuit. The D/A typically has 5 bits of resolution, with a 1-bit step changing the voltage threshold by 1 mV, for a total adjustment range of +/−16 mV. At the time of assembly, various small errors may be present, due to the tolerances of the fixed resistors, as well as errors in the bandgap circuit. The worst-case threshold error due to the cumulative effect of these errors is generally known to be less than 16 mV. Therefore, this threshold error may be compensated by setting the D/A to the appropriate value. This may be performed by adding zero jumper wires to program the D/A.

As a more detailed example, assume that it is desired to set the voltage threshold to exactly 4.000 V. Without the D/A converter in the circuit, the voltage thresholds for various numbers of manufactured circuits would vary over some range, and may typically fall within a tolerance or range of +/−10 mV from the target of 4.000 V (i.e. ranging from 3.990 V to 4.010 V). In order to reduce this error, the D/A converter is added to each circuit, for "trimming" the circuit after final assembly. Each bit in the D/A moves the threshold by 1 mV (0.001 V). As part of the calibration process of the circuit, the D/A may initially be set to its midpoint, which is 10000 (for a 5-bit D/A). The voltage threshold may now be measured. If it is exactly 4.000 V, the D/A input at 10000 may remain unchanged. However, if the voltage threshold is measured to be 3.993 V, which is 7 mV less than the target of 4.000 V, the D/A input may be increased by 7 counts, to be 10111. This would increase the voltage threshold by 7 mV, bringing it to the desired 4.000 V. The voltage threshold could then be re-measured to verify that it is actually 4.000 V. Jumper wires at the D/A input may next be soldered in place, to permanently set the input code to 10111. This methodology for "trimming" the circuit might have been accomplished in the past using a small potentiometer, or by soldering a "Select at Test" (SAT) resistor in place. To specify a D/A converter with the appropriate number of bits, requires knowing the maximum range of adjustment (20 mV in the example) and the voltage perturbation (or value) of each bit (1 mV in the example). Then the ratio (20 in this example) can be calculated. The number of bits (N) is then calculated and must be selected as follows: $2^N$>ratio. In the example, since $(2)^4$=16 and $(2)^5$=32, 32 was selected, because 32>20, whereas 16<20. In other words, a 4-bit (or smaller) D/A would either have insufficient range, or insufficient resolution, so a 5-bit D/A would be utilized in this example.

Figure 4:
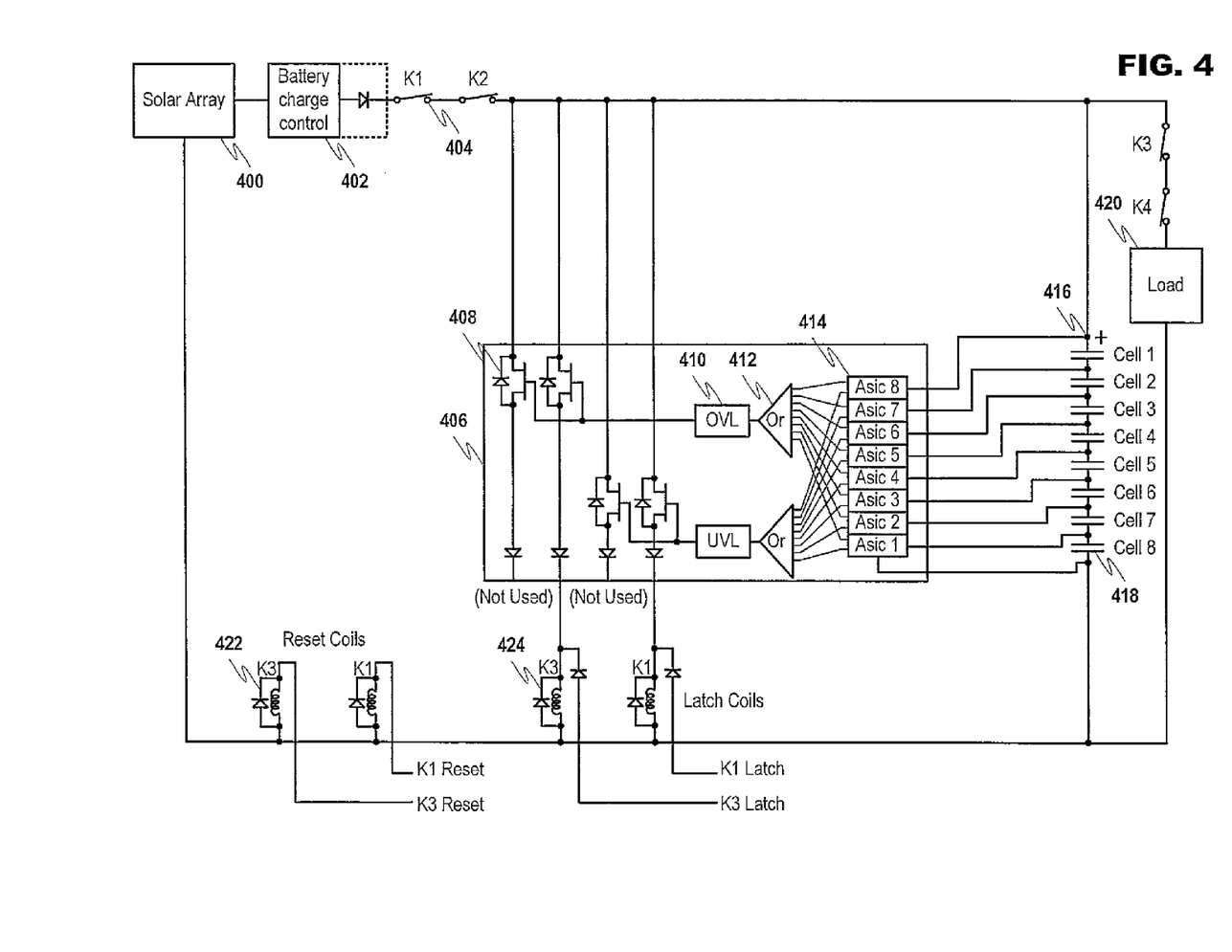
FIG. 4 discloses an alternative example battery overcharge protection circuit in accordance with at least one embodiment of the present invention.

In accordance with at least one embodiment of the present invention, the example circuit of FIG. 4 discloses a battery charge level protection system for a satellite. The example circuit may comprise solar array 400 and battery charge control 402, which may be coupled to the remainder of the circuit (including battery 416) via relays K1 and K2 as disclosed at 404. In addition, load 416 may be coupled to the rest of the circuit (including battery 414) via relays K3 and K4. During in-light satellite operation, all relays may be closed and power may be supplied to both battery 414 and/or load 420. Card 406 may comprise a monitoring circuit 414 for each cell 418 of battery 416. In at least one example implementation, each monitoring circuit may be comprised within a single application specific integrated circuit (ASIC). Each monitoring circuit 414 may monitor the charge of each cell 418 in order to detect if over-voltage or under-voltage conditions exist. If either condition exists, monitoring circuit 414 corresponding to the problem cell 418 may generate a certain output, such as a logical 1. The outputs of all monitoring circuits 412 may then be combined via logical OR 412 so that if any battery cell is over-voltage or under voltage, corresponding logic 410 (e.g., over-voltage logic, OVL, or under-voltage logic, UVL) may trigger the corresponding redundant relay control circuit 408. As a result one or both of relays K1 and K2 may actuate (e.g., open) in an monitored over-voltage situation, and one or both of relays K3 and K4 may actuate (e.g., open) in a monitored under-voltage situation.

Figure 5:
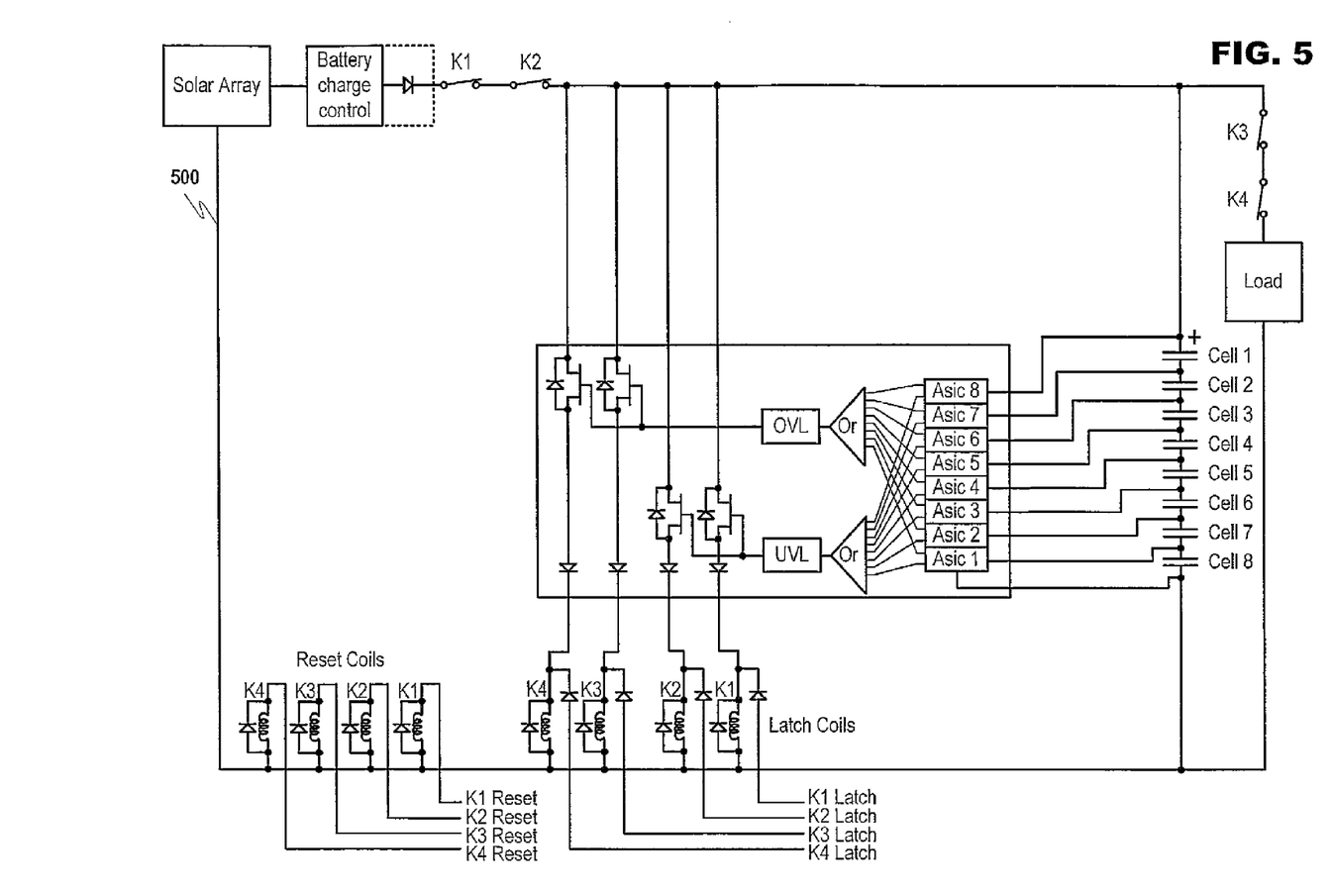
FIG. 5 discloses an alternative example battery overcharge protection circuit, including redundant reset and latch coils, in accordance with at least one embodiment of the present invention.
Figure 6:
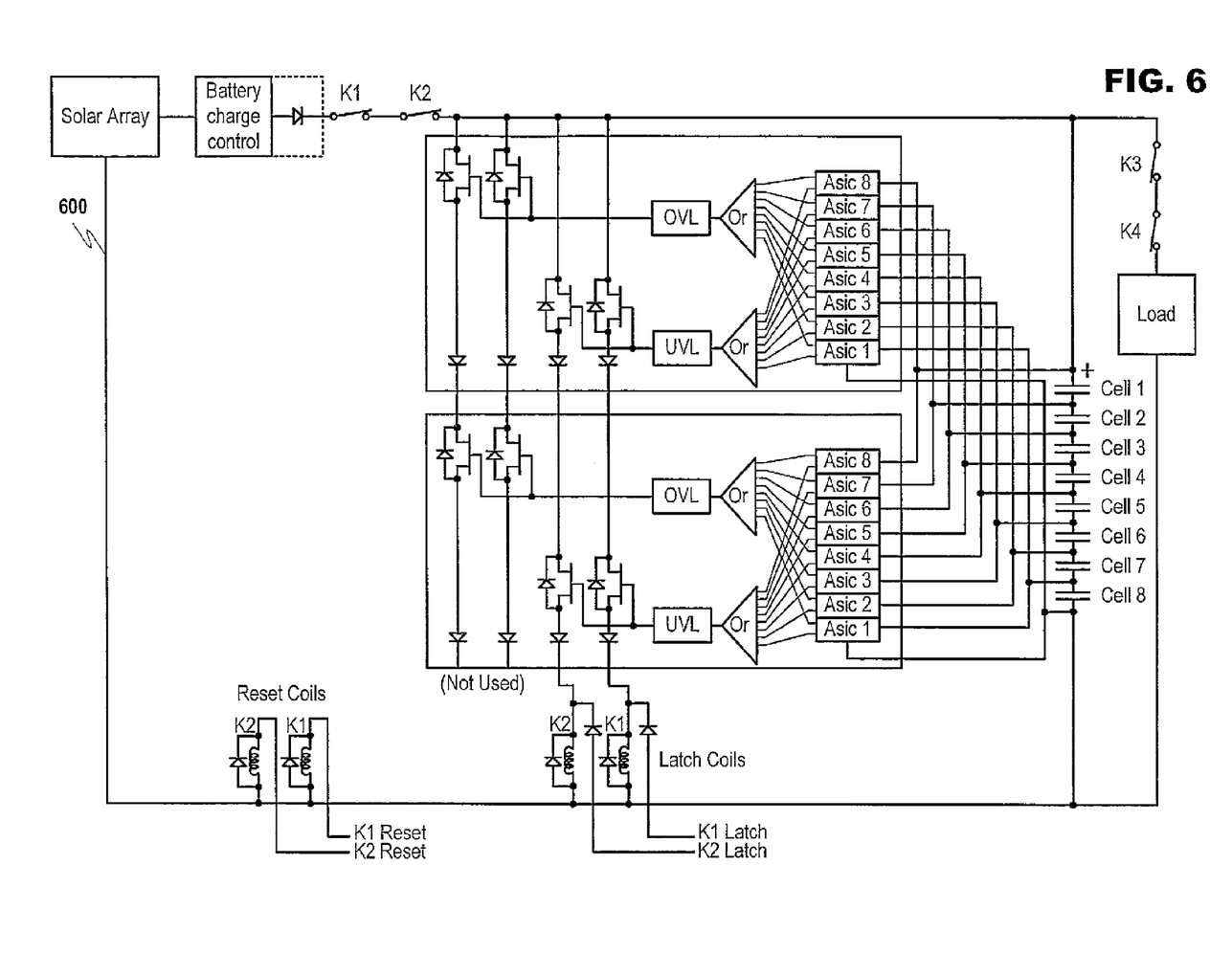
FIG. 6 discloses an alternative example battery overcharge protection circuit, including redundant cell monitoring circuits and dual redundant relay control circuits, in accordance with at least one embodiment of the present invention.
Figure 7:
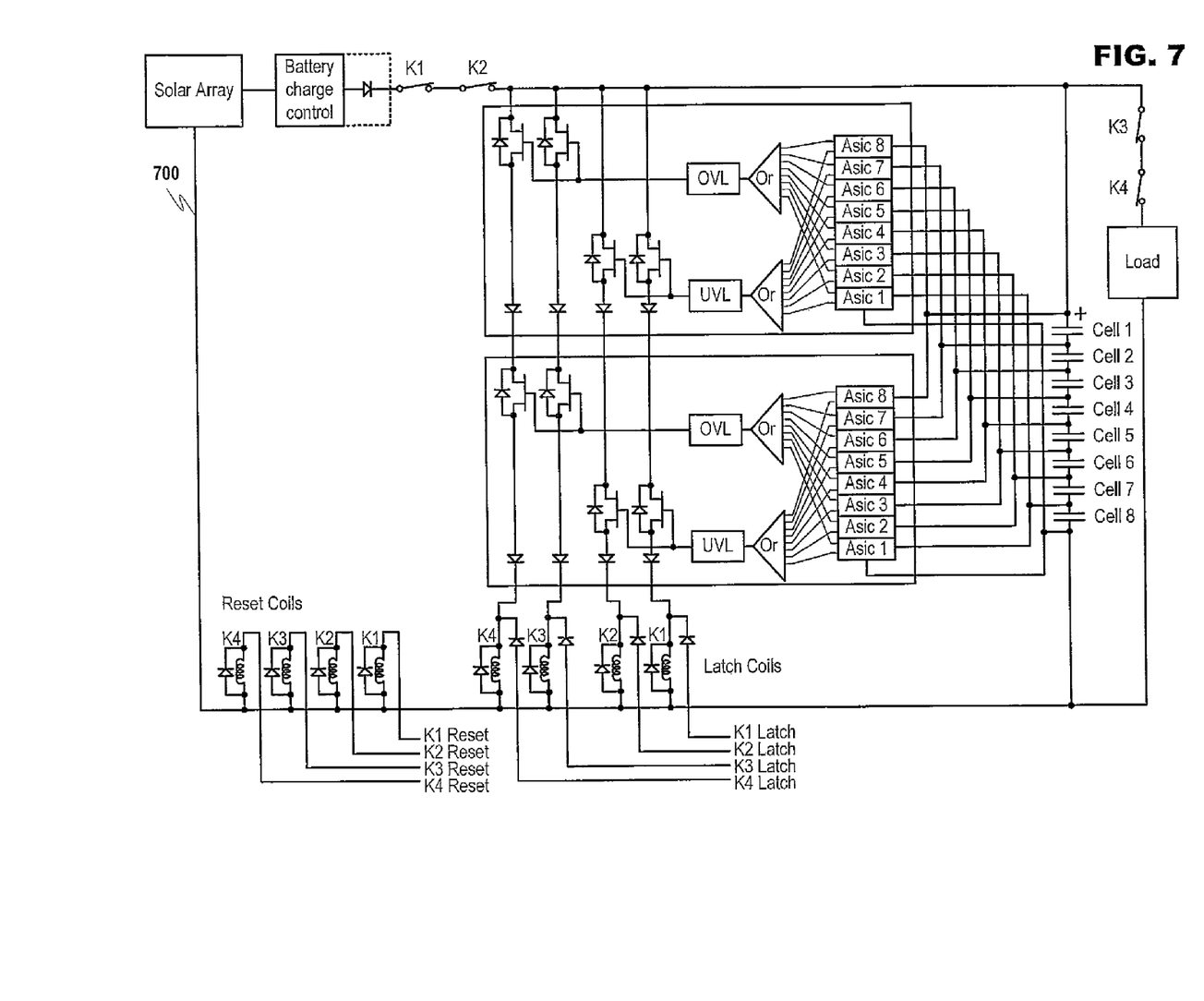
FIG. 7 discloses an alternative example battery overcharge protection circuit, including redundant reset coils, latch coils, cell monitoring circuits and dual redundant relay control circuits, in accordance with at least one embodiment of the present invention.

In at least one example implementation, the circuit of FIG. 4 may further comprise reset coils 422 and latch coils 424 for forcing the actuation of relays K1 and K3. For example, reset coils 422 may cause relays K1 and/or K3 to reset (close), while latch coils 422 may cause relays K1 and K3 to latch (open). FIG. 5-7 disclose alternative configurations based on the circuit disclosed in FIG. 4. For example, circuit 400 in FIG. 4 may comprise reset coils and latch coils corresponding to each of relays K1, K2, K3 and K4, which may provide further control in the circuit. FIG. 6 discloses an example circuit 600 that comprises two identical sets of monitoring and relay control circuits. The configuration disclosed in FIG. 6 may improve the reliability of the battery protection circuit by providing redundancy in the monitoring and relay triggering aspects of the circuit. If one of the cards fail (e.g., due to radiation exposure or an SEU), the other card may still prevent over-voltage and under-voltage situations. In addition, while the redundant monitoring and relay triggering circuits are disclosed on two separate cards, it may also be possible for a single card to comprise both circuits. FIG. 7 combines the aspects of FIGS. 5 and 6 into circuit 700. In particular, the additional reset coils added in FIG. 5 and the redundant monitoring and relay triggering circuits introduced in FIG. 6 are both present in FIG. 7. Circuit 700 is an example of how the inclusion of redundant functionality may help to ensure continuous circuit performance even in view of harsh operating conditions like outer space.

In accordance with various embodiments of the present invention, actual battery protection circuits may have characteristics that are particularly suited towards the applications in which the circuit is being applied. Example characteristics and/or parameters that may apply to battery protection circuits being implemented in satellites include an operating temperature range of −20° C. to +60° C. The Bandgap Reference may have a Trim (on wafer) to 1.250 V, +1.0 mV (with D/A set to midpoint), a Temperature Stability: +4.0 mV over entire temperature range, a Total Dose Stability: +5.0 mV for 100 krad and an Aging Stability: +5.0 mV over 15 year life. An Over-Voltage (OV) Threshold may be set by a digital to analog (D/A) converter to 4.500 V, +2.0 mV, Temperature Stability: +12.0 mV over entire temperature range, PNP (Q1) turns on for Vcell>4.500 V and PNP (Q1) turns off for Vcell<4.300V (hysteresis=200 mV). the D/A Converter may have 5 bits (32 levels), 1 LSB moves BG output by 1.0 mV (±16 mV from midpoint). Test Injection 1 (OV) when not connected (floating), has no effect. When connected to ground (0 V) or to any voltage between 0V and −60 V, causes BG voltage to drop from 1.250 V to 0.75 V. (This forces an artificial OV output for test purposes).

In an example application such as in a satellite, an under-voltage (UV) Threshold may be set in the circuit using external resistors to 2.700V, PNP (Q2) turns on for Vcell>2.800 V, PNP (Q2) turns off for Vcell<2.700 V (hysteresis=100 mV). Test Injection 2 (UV) when not connected (floating), has no effect. When connected to ground (0 V) or to any voltage between 0V and −60 V, causes BG voltage to increase from 1.250 V to 2.08 V. (This forces an artificial UV output for test purposes). When the comparator output is high, the PNP is off. The base-emitter resistor on the PNP must hold VBE below 0.2 V (with Icbo) over the full temperature range. When comparator output is low, PNP turns on. Comparator must sink adequate base current for PNP under all conditions, including low temperature (−20° C.) and low cell voltage (2.6 V). This must also work properly for Test Injection inputs. When the PNP is on, its Ic must be 200 uA, ±30 uA.

The Operating Voltage Range for an example battery protection circuit applied in a satellite application may be 0 V to +7.0 V. No spurious outputs (from both PNP transistors) for any cell voltage (0V to +7.0 V) The Supply Current may be as low as possible (e.g., <5 mA) and the Die Size may be as small as possible in order to minimize footprint for use in satellites.

The various embodiments of the present invention are not limited only to the examples disclosed above, and may encompass other configurations or implementations.

For example, embodiments of the present invention may encompass a method comprising measuring the charge of each of one or more cells in a battery, generating a certain output if the charge of any of the one or more cells is measured to be at or above a predetermined charge level, and, if the certain output is detected, disconnecting the battery from a power source.

For example, embodiments of the present invention may encompass an apparatus comprising means for measuring the charge of each of one or more cells in a battery, means for generating a certain output if the charge of any of the one or more cells is measured to be at or above a predetermined charge level, and means for, if the certain output is detected, disconnecting the battery from a power source.

For example, embodiments of the present invention may encompass electronic signals that cause an apparatus to measure the charge of each of one or more cells in a battery, generate a certain output if the charge of any of the one or more cells is measured to be at or above a predetermined charge level, and, if the certain output is detected, disconnect the battery from a power source.

For example, embodiments of the present invention may encompass a system comprising a battery comprising one or more cells; an energy source; a load; and a circuit coupled to at least the battery, the energy source and the load, the circuit comprising one or more elements configured to measure the charge of each of the one or more cells and to disconnect the one or more cells from the energy source if the charge of any of the one or more cells is at or above a predetermined charge level.

The above example system may further comprise one or more elements comprising a monitoring circuit for each cell and redundant relay control circuits, the monitoring circuit being configured to generate a certain output to the redundant relay control circuits if the cell is at or above the predetermined charge level.

The above example system may be further described wherein the certain output is a logical one or zero.

The above example system may be further described wherein each monitoring circuit further comprises at least one test injection point configured to accept an externally supplied voltage for causing the circuit to operate regardless of whether the one or more cells are at or above the predetermined charge level.

The above example system may be further described wherein the circuit further comprises redundant monitoring circuits for each of the one or more cells.

The above example system may be further described wherein the monitoring circuits are each comprised within an application specific integrated circuit (ASIC).

The above example system may further comprise disconnecting the one or more cells from the energy source further comprising actuating redundant relays comprised within the circuit by opening at least one of two relays arranged serially between the battery and the energy source.

The above example system may be further described wherein the one or more elements further comprise at least one of reset coil circuits or latch coil circuits configured to actuate the redundant relays.

The above example system may further comprise the one or more elements being configured to disconnect the one or more cells from the load if the charge of any of the one or more cells is at or below a second predetermined charge level.

The above example system may be further described wherein the one or more elements comprise a monitoring circuit for each cell, a first set of redundant relay control circuits and a second set of redundant relay control circuits, the monitoring circuit being configured to generate a first certain output to the first set of redundant relay control circuits if the cell is at or above the predetermined charge level, and to generate a second certain output to the second set of redundant relay control circuits if the cell is at or below the second predetermined charge level.

The above example system may be further described wherein the first certain output is a logical one or zero and the second certain output is a logical one or zero.

The above example system may be further described wherein each monitoring circuit further comprises at least one test injection point configured to accept an externally supplied voltage for causing the circuit to operate regardless of whether the one or more cells are at or above the predetermined charge level or at or below the second predetermined charge level.

The above example system may be further described wherein the circuit comprises redundant monitoring circuits for each of the one or more cells.

The above example system may be further described wherein the monitoring circuits are each comprised within an application specific integrated circuit (ASIC).

The above example system may further comprise disconnecting the one or more cells from the load further comprising actuating redundant relays comprised within the circuit by opening at least one of two relays arranged serially between the battery and the load.

The above example system may be further described wherein the one or more elements further comprise at least one of reset coil circuits or latch coil circuits configured to actuate the redundant relays.

For example, embodiments of the present invention may encompass an electronic component comprising a monitoring circuit configured to monitor a voltage and to generate a certain output if the monitored voltage is at or above the predetermined level; and at least one test injection point configured to accept an externally supplied voltage for causing the monitoring circuit to generate the certain output regardless of whether the monitored voltage is at or above the predetermined charge level.

The above example electronic component may further comprise the certain output being a logical one or zero.

For example, embodiments of the present invention may encompass an electronic component comprising a monitoring circuit configured to monitor a voltage and to generate a certain output if the monitored voltage is at or above a predetermined voltage level and to generate a second certain output if the monitored voltage is at or below a second predetermined voltage level; and at least one test injection point configured to accept an externally supplied voltage for causing the monitoring circuit to generate at least one of the first certain output or the second certain output regardless of whether the monitored voltage is at or above the predetermined voltage level or at or below the second predetermined voltage level.

The above example electronic component may further comprise the certain output being a logical one or zero.

Accordingly, it will be apparent to persons skilled in the relevant art that various changes in form and detail can be made therein without departing from the spirit and scope of the disclosure. The breadth and scope of the present disclosure should not be limited by any of the above-described example embodiments, but should be defined only in accordance with the following claims and their equivalents.

What is claimed:

1. A multiply redundant battery-recharge protection circuit, for use in preventing a rechargeable battery with one or more cells from being overcharged by a solar panel array, said multiply redundant battery protection circuit comprising:
   a first group and a second group of comparator circuits, each group having a respective comparator circuit for each of the one or more cells of the battery, said respective comparator circuit of each of said first and second groups independently supplying a digital output if a respective cell is determined to be overcharged by being at or exceeding an upper threshold voltage;
   a first logic gate and a second logic gate, said first and second logic gates providing a respective "or" operation for said comparator circuits of said first and second groups, each of said logic gates supplying a digital signal when one comparator circuit within its respective group supplies said digital output;
   a first P-channel field effect transistor wired in parallel with a second P-channel field effect transistor, with each said first and second field effect transistors having its gate terminal being respectively coupled to said first logic gate to be capable of receiving said digital output;
   a third P-channel field effect transistor wired in parallel with a fourth P-channel field effect transistor, with said third and fourth field effect transistors being wired respectively in series with said first and second field effect transistors, and with each said third and fourth field effect transistors having its gate terminal being respectively coupled in parallel to said second logic gate, to independently receive said digital output therefrom;
   a first relay and a second relay; said first relay being coupled in series with said third field effect transistor; said second relay being coupled in series with said fourth field effect transistor; each said first and second relays having coils being respectively energized to cause isolation of the battery upon said first and third field effect transistors turning on after receiving said digital signal of said first and second logic gates and said second and fourth field effect transistors turning on after receiving said digital signal of said first and second logic gates; and
   wherein said circuit provides multiply redundant battery-recharge protection comprising: redundantly assessing said determination of overvoltage; redundantly triggering said recharge isolation of the battery; and preventing inadvertent isolation and non-charging, occurring absent said overvoltage, through redundancy with said first and second isolation relays.

2. A multiply redundant battery-recharge protection circuit according to claim 1 wherein said third and fourth field effect transistors being wired respectively in series with said first and second field effect transistors comprises each of said third and fourth field effect transistors having a source terminal being electrically coupled to a respective drain terminal of said first and said second field effect transistors, with said first and second field effect transistors having a source terminal being electrically coupled to the battery positive terminal.

3. A multiply redundant battery-recharge protection circuit according to claim 2 wherein said first relay being coupled in series with said third field effect transistor comprises coupling to a drain terminal of said third field effect transistor; and wherein said second relay being coupled in series with said fourth field effect transistor comprises coupling to a drain terminal of said fourth field effect transistor.

4. A multiply redundant battery-recharge protection circuit according to claim 3 further comprising:
   a first diode connected in series between a source terminal of said third field effect transistor and said first relay, and being conductive in a direction from said third field effect transistor to said first relay; and
   a second diode connected in series between a source terminal of said fourth field effect transistor and said second relay, and being conductive in a direction from said fourth field effect transistor to said second relay.

5. A multiply redundant battery-recharge protection circuit according to claim 4 further comprising: a diode coupled in parallel with said first relay and being conductive in a discharge direction; and
   a diode coupled in parallel with said second relay and being conductive in a discharge direction.

6. A multiply redundant battery-recharge protection circuit according to claim 5 wherein said first and second groups of comparator circuits supplying an output comprise a PNP transistor being turned on by a respective comparator within each of said comparator circuits to supply said digital output; and wherein said upper threshold voltage for each said respective comparator is supplied by a band gap reference.

7. A multiply redundant battery-recharge protection circuit according to claim 6 wherein when said rechargeable battery comprises a lithium ion battery, said upper threshold voltage is about 4.5 volts.

8. A multiply redundant battery-recharge protection circuit according to claim 5 wherein each of said first and second groups of comparator circuits comprises:
   a first pair of comparators; said first pair of comparators providing said determination of said corresponding cell being overcharged and triggering a first PNP transistor to signal said respective OR gate; and
   a second pair of comparators, said second pair of comparators providing a determination of over-discharging of said corresponding cell by being at or below a lower threshold voltage, and thereafter triggering a first PNP transistor to signal a third and fourth respective undervoltage OR gates, said third and fourth respective OR gates outputting to a third and fourth relay to open to disconnect the battery from the load.

9. A multiply redundant battery-recharge protection circuit according to claim 8,
   wherein said first pair of comparators comprises:
      a first comparator having a non-inverting input terminal coupled in series with a first resistance that is coupled in series to a band gap reference; and having an inverting input terminal coupled to both a positive terminal of said respective cell through a second resistance and to a negative terminal of said respective cell through a third and a fourth resistance; said first comparator having an output terminal coupled to said first PNP transistor through a fifth resistance;
a second comparator having a non-inverting input terminal coupled in parallel to the output of said first comparator, and having its output terminal coupled in parallel to provide feedback to said non-inverting terminal of said first comparator through a sixth resistance; and wherein said second pair of comparators comprises:
a third comparator having a non-inverting input terminal coupled in series with in series with a seventh resistance that is coupled in series to said band gap reference; and having an inverting input terminal coupled to both said positive terminal of said respective cell through said second and third resistances and to said negative terminal of said respective cell through said fourth resistance; said third comparator having an output terminal coupled to said second PNP transistor through an eighth resistance; and
a fourth comparator having a non-inverting input terminal coupled in parallel to the output of said third comparator, and having its output terminal coupled in parallel to provide feedback to said non-inverting terminal of said third comparator through a ninth resistance; said fourth comparator having its inverting input terminal coupled to the inverting input terminal of said second comparator with a voltage bias.

10. A multiply redundant battery-recharge protection circuit according to claim 9 wherein said band gap reference comprises a first test injection point for use in causing an artificial overvoltage test by causing said reference voltage to drop.

11. A multiply redundant battery-recharge protection circuit according to claim 10 wherein said band gap reference comprises a second test injection point for causing an artificial under-voltage test by causing said reference voltage to increase.

12. A multiply redundant battery-recharge protection circuit according to claim 11 further comprising a digital to analog converter for setting said over-voltage and/or under-voltage thresholds.

13. A multiply redundant battery-recharge protection circuit according to claim 12 wherein said band gap reference is set to 1.250V±1.0 mV; and wherein said first test injection point causes an artificial overvoltage test by causing said reference voltage to drop from 1.250 V to 0.75 V; and wherein said second test injection point causes an artificial under-voltage test by causing said reference voltage to increase from 1.250 V to 2.08 V.

14. A multiply redundant battery-recharge protection circuit according to claim 12 wherein said band gap reference exhibits a temperature stability of +4.0 mV over entire orbital temperature range; a total dose stability of +5.0 mV for 100 krad; and an aging stability of +5.0 mV over a 15 year life.

15. A multiply redundant battery-recharge protection circuit according to claim 14 wherein when said rechargeable battery comprises a lithium ion battery, said upper threshold voltage is about 4.5 volts, and said lower threshold voltage is about 2.7 volts.

16. A multiply redundant battery-recharge protection circuit according to claim 15 wherein said first, second, third, and fourth relays each comprise latch coils and reset coils; and wherein said latch coils cause said relays to open during said overvoltage or said under-voltage; and wherein said reset coils cause said relays to close subsequent to said overvoltage or said over-discharge condition.

17. A multiply redundant battery-recharge protection circuit, for use in radiation-hardening of satellites against the effects of total dose and/or single event upset radiation to prevent a rechargeable battery with one or more cells from being overcharged, said multiply redundant battery protection circuit comprising:
a first group of comparator circuits with a respective comparator circuit for each of the one or more cells of the battery, each of said comparator circuits of said first group comprising a comparator, said comparator supplying a digital output if said respective cell voltage exceeds a threshold level;
a first logic gate, said first logic gate providing an "or" operation wherein, if any one of said comparators of said first group of comparator circuits supplies said digital output, said first logic gate supplies a digital signal;
a second group of comparator circuits with a respective comparator circuit for each of the one or more cells of the battery, each of said comparator circuits of said second group comprising a comparator, said comparator independently supplying a digital output if said respective cell voltage exceeds said threshold level;
a second logic gate, said second logic gate providing an "or" operation, wherein if any one of said comparators of said second group of comparator circuits supplies said digital output, said first logic gate supplies a digital signal;
a first P-channel field effect transistor and a second P-channel field effect transistor, said first field effect transistor being wired in parallel with said second field effect transistor, with each of said first and second field effect transistors having a source terminal being electrically coupled to the battery positive terminal, and having a gate terminal being coupled in parallel to said first logic gate to be capable of receiving said digital output therefrom;
a third P-channel field effect transistor and a fourth P-channel field effect transistor, said third field effect transistor being wired in parallel with said fourth field effect transistor, with each of said third and fourth field effect transistors having a source terminal being electrically coupled to a respective drain terminal of said first and said second field effect transistors, and with a gate terminal of each of said third and fourth field effect transistors being respectively coupled in parallel to said second logic gate to be capable of receiving output therefrom;
a first relay and a second relay; said first relay being connected in series with a drain terminal of said third field effect transistor; and a diode coupled in parallel with said first relay and being conductive in a discharge direction; said second relay being connected in series with a drain terminal of said fourth field effect transistor; and a diode coupled in parallel with said second relay and being conductive in a discharge direction;
a first diode connected in series between said drain terminal of said third field effect transistor and said first relay and being conductive in a direction from said third field effect transistor to said first relay;
a second diode connected in series between said drain terminal of said fourth field effect transistor and said second relay and being conductive in a direction from said fourth field effect transistor to said second relay; and wherein when said voltage of a respective cell of any one of said one or more cells is higher than said threshold level as determined by a respective comparator of said first group of comparator circuits and said second group of comparator circuits, said digital signal of said first logic gate turns on said first field effect transistor and said digital signal of said second logic gate turns on said third field effect transistor to energize a coil of said first relay to isolate the battery; and said digital signal of said first logic gate turns on said second field effect transistor and said digital signal of said second logic gate turns on said fourth field effect transistor to energize a coil of said second relay to isolate the battery.

18. A multiply redundant battery-recharge protection circuit according to claim 17 wherein said threshold voltage level for each said comparator circuits is supplied by a corresponding band gap reference.

19. A multiply redundant battery-recharge protection circuit according to claim 18 wherein said first and second comparator circuits supplying an output comprises a PNP transistor turning on.

20. A multiply redundant battery-recharge protection circuit according to claim 19 wherein when said rechargeable battery comprises a lithium ion battery, said upper threshold voltage is about 4.5 volts.

* * * * *